United States Patent [19]
Carr et al.

[11] Patent Number: 5,870,007
[45] Date of Patent: Feb. 9, 1999

[54] MULTI-DIMENSIONAL PHYSICAL ACTUATION OF MICROSTRUCTURES

[75] Inventors: William N. Carr, Montclair; Xi-qing Sun, Kearny, both of N.J.

[73] Assignee: Roxburgh Ltd., Douglas, Isle of Man

[21] Appl. No.: 877,004

[22] Filed: Jun. 16, 1997

[51] Int. Cl.$^6$ .................................................... H02N 2/04
[52] U.S. Cl. .......................................... 333/262; 333/197
[58] Field of Search ................................... 333/262, 186, 333/197

[56] References Cited

U.S. PATENT DOCUMENTS

| | | | |
|---|---|---|---|
| 5,258,591 | 11/1993 | Buck | 200/268 X |
| 5,367,136 | 11/1994 | Buck | 200/600 |
| 5,578,979 | 11/1996 | Yao | 333/262 |
| 5,629,918 | 5/1997 | Ho et al. | 369/112 |

OTHER PUBLICATIONS

*The 8th International Conference on Solid–State Sensors and Actuators and Eurosensors IX, Digest of Technical Papers,* vol. 1, Jun. 1995, pp. 297–300, Toshiyoshi et al, "An Electrostatically Operated Torsion Mirror for Optical Switching Device".

*The 8th International Conference on Solid–State Sensors and Actuators and Eurosensors IX, Digest of Technical Papers,* vol. 1, Jun. 1995, pp. 289–292, Marxer et al, "MH$_z$ Opto–Mechanical Modulator".

*The 8th International Conference on Solid–State Sensors and Actuators and Eurosensors IX, Digest of Technical Papers,* vol. 1, Jun. 1995, pp. 351–354, Noda et al, "Micromachined Optical Circular Gratings for Surface Light–Emitting Devices".

*The 8th International Conference on Solid–State Sensors and Actuators and Eurosensors IX, Digest of Technical Papers,* vol. 1, Jun. 1995, pp. 417–420, Lee et al, "Self–Excited Piezoelectric Cantilever Oscillators".

*IEEE Proceedings, Micro Electro Mechanical Systems,* IEEE Catalog No. 93CH3265-6, Feb. 7–10, 1993, pp. 124–127, Jaecklin et al, "Optical Microshutters and Torsional Micromirrors for Light Modulator Arrays".

*Journal of Microelectromechanical Systems,* vol. 5, No. 4, Dec. 1996, Fedder et al, pp. 283–297, "Multimode Digital Control of a Suspended Polysilicon Microstructure".

*Micromechanical Microengineering,* 4 (1994), pp. 157–171, Shoji et al, "Microflow Devices and Systems".

*Technical Digest, Solid–State Sensor and Actuator Workshop,* Jun. 3–6, 1996, pp. 174–177 Comtois et al, "Surface Micromachined Polysilicon Thermal Actuator Arrays and Applications".

*Primary Examiner*—Robert Pascal
*Assistant Examiner*—Justin P. Bettendorf
*Attorney, Agent, or Firm*—Ohlandt, Greeley, Ruggiero & Perle

[57] ABSTRACT

A microstructure includes a substrate and a movable platform which is tethered by a first cantilever arm to the substrate. The first cantilever arm is comprised of a sandwich of first and second materials, the first and second materials exhibiting either different thermal coefficients of expansion or a piezoelectric layer. A second cantilever arm includes a first end which is tethered to the platform and a free distal end which is positioned to engage the substrate. The second cantilever arm is constructed similarly to the first cantilever arm. A controller enables movement of the platform through application of signals to both the first cantilever arm and the second cantilever arm to cause flexures of both thereof. The second cantilever arm, through engagement of its free end with the substrate, aids the action of the first cantilever arm in moving the platform. Further embodiments include additional cantilever arms which are independently controllable to enable multiple ranges of movement of the platform by selective actuation of the cantilever arms; and plural opposed cantilever arms that are connected between the substrate and the platform, but are independently controllable to achieve complex modes of movement of the platform. A further embodiment includes plural actuation regions within each cantilever arm to enable countermovements of each cantilever arm to be achieved.

19 Claims, 7 Drawing Sheets

MULTI-DIMENSIONAL PHYSICAL ACTUATION OF MICROSTRUCTURES

FIELD OF THE INVENTION

This invention relates to movable microstructures that are formed through use of semiconductor fabrication processes and, more particularly, to multi-dimensional physical actuating mechanisms for such microstructures.

BACKGROUND OF THE INVENTION

Silicon "micromachining" has been developed as a means for accurately fabricating microscopically-small structures. Such processing involves a selective etching of a silicon substrate and a deposition thereon of thin film layers of various materials, both semiconductor and otherwise. Various sacrificial layers are employed to enable the construction of physically movable parts that exhibit microscopic sizes.

Silicon micromachining has been applied to fabrication of micromachines that include rotary and linear bearings. Such bearings have spawned further development of electrically-driven motors which exhibit a planar geometry and lateral dimensions on the order of 100 microns or so. In addition to micromotors, microactuators utilizing cantilever arrangements have also been developed. Such cantilever arrangements employ superposed layers of different materials, each material exhibiting a different thermal co-efficient of expansion (TCE). When the layers are heated, unequal expansion thereof causes a deflection of the cantilever structure.

Cantilever arms have also been fabricated using piezoelectric films which exhibit a large $d_{31}$ characteristic. If such a piezoelectric film is sandwiched between a pair of electrodes and is coupled in a cantilever fashion to an electrical contact, application of a voltage across the electrodes causes a flexure of the piezoelectric film and a corresponding movement of the cantilever arm.

In lieu of constructing a cantilever arm having an unattached free end, other prior art has employed a "tied down" cantilever structure to provide a buckling action upon actuation by either a piezoelectric force or a thermally actuated differential expansion action. Piezoelectrically-actuated cantilever devices have also been proposed for a variety of applications, e.g., to control the orientation of micro-mirrors for the purpose of creating an optical switching effect.

The application of electrostatic attraction and repulsion to microactuators has been suggested. In that regard, the following prior art references are relevant: Fedder et al., "Multimode Digital Control of a Suspended Polysilicon Microstructure", Journal of Microelectromechanical Systems, Volume 5, No. 4, December 1996, pages 283–297; Toshiyoshi et al., "An Electrostatically Operated Torsion Mirror for Optical Switching Device", Eighth International Conference on Solid State Sensors and Actuators, Stockholm, Sweden, Jun. 25–29, 1995, pages 297–300; Marxer et al., "MHz Opto-mechanical Modulator", Eighth International Conference on Solid State Sensors and Actuators, Jun. 25–29, 1995, pages 289–292; and U.S. Pat. No. 5,578,976 to Yao; 5,367,136 to Buck and 5,258,591 to Buck.

Physically movable microstructures have been applied to a number of applications. For instance, see Jaecklin et al. "Optical Microshutters and Torsional Micromirrors for Light Modulator Arrays", Proceedings IEEE Microelectromechanical Systems, Fort Lauderdale, Fla., Feb. 7–10, 1993, pages 124–127. Jaecklin et al. disclose a movable shutter arrangement wherein the shutter is positioned on a meander spring which is operated electrostatically to move the shutter in relation to a light-receiving aperture. Comtois et al., "Surface Micromachined Polysilicon Thermal Actuator Arrays and Applications", Solid State Sensor and Actuator Workshop, Hilton Head, South Carolina, Jun. 2–6, 1996, pages 174–177, describe a thermal actuator array wherein a gear structure is rotated to cause the movement of a hinged mirror. Both a thermally actuated gear impeller and a thermally actuated hinged pusher actuator are single layer structures for operating a stepper motor structure.

Shoji et al., "Microflow Devices and Systems", Journal of Micromechanical Microengineering, Volume 4, 1994, pages 157–171, disclose many microvalve, micropump and microflow sensor arrangements that are fabricated using micromachining techniques. Shoji et al. disclose the use of electromagnetic, piezoelectric, pneumatic, shape memory alloy/bias spring, electrostatic, thermopneumatic, electromagnetic and bimetallic techniques for movement of microstructures.

Piezoelectric cantilevers have been utilized in the prior art to construct oscillating structures. Lee et al. "Self-Excited Piezoelectric Cantilever Oscillators", Eighth International Conference on Solid State Sensors and Actuators . . .", Jun. 25–29, 1995, pages 417–420 describe a micromachined, self-excited piezoelectric cantilever which employs a zinc oxide piezoelectric thin film between two aluminum layers on a supporting layer of low-stress silicon nitride. A driving amplifier has sufficient gain to cause the piezoelectric cantilever to oscillate and produce an acoustic output.

Notwithstanding the many actuation mechanisms described in the above-noted prior art, there remains a need for actuation structures which enable a wide range of movement of the actuated device. Further, there is a need for actuation structures provide wide movement angles and large actuation extents.

Accordingly, it is an object of this invention to provide an improved actuator for a microstructure which exhibits multidimensional actuation capability.

It is another object of this invention to provide an improved physical actuator for a microstructure, wherein complex movement of the microstructure is possible.

It is yet another object of this invention to provide an improved physical actuator of a microstructure wherein complex movements of the microstructure can be achieved through either piezoelectric or thermal actuation mechanisms.

SUMMARY OF THE INVENTION

A microstructure includes a substrate and a movable platform which is tethered by a first cantilever arm to the substrate. The first cantilever arm is comprised of a sandwich of first and second materials, the first and second materials exhibiting either different thermal coefficients of expansion or a piezoelectric layer. A second cantilever arm includes a first end which is tethered to the platform and a free distal end which is positioned to engage the substrate. The second cantilever arm is constructed similarly to the first cantilever arm. A controller enables movement of the platform through application of signals to both the first cantilever arm and the second cantilever arm to cause flexures of both thereof. The second cantilever arm, through engagement of its free end with the substrate, aids the action of the first cantilever arm in moving the platform. Further embodiments include additional cantilever arms which are independently controllable to enable multiple ranges of movement of the platform by selective actuation of the cantilever arms; and plural opposed cantilever arms that are connected between the substrate and the platform, but are independently controllable to achieve complex modes of movement of the platform. A further embodiment includes plural actuation regions within each cantilever arm to enable countermovements of each cantilever arm to be achieved.

BRIEF DESCRIPTION OF THE DRAWINGS

FIG. 4b is a schematic side view of the microstructure actuating mechanism of FIG. 4a.

DETAILED DESCRIPTION OF THE INVENTION

Figure 1:
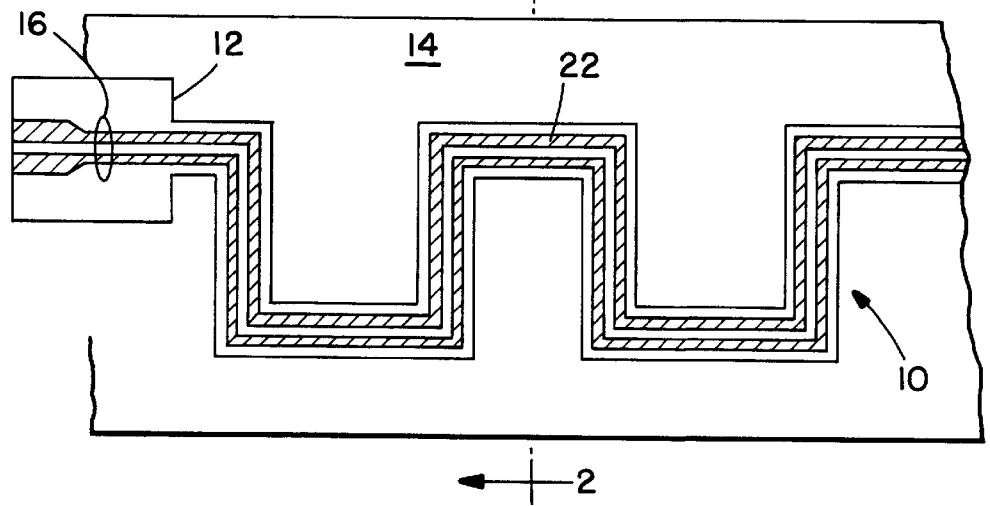
FIG. 1 is a plan view of a cantilever arm exhibiting a meandering configuration and further including a conductive heater trace positioned therein.
Figure 2:
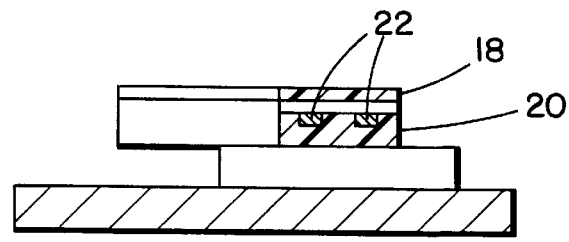
FIG. 2 is a sectional view taken along line 2—2 in FIG. 1.

As will be hereafter understood, in the embodiments shown in FIGS. 1–10, meander cantilever structures are employed to provide actuation of a tethered platform. In FIG. 1, illustrates a magnified view of a segment of a meander cantilever arm 10. FIG. 2 shows a sectional view of the structure of FIG. 1, taken along line 2—2.

Cantilever arm 10 comprises plural material layers which, in response to a stimulus, exhibit different expansion/ contraction rates, thereby establishing stresses within cantilever arm 10 that cause a flexure thereof. In one embodiment, cantilever arm 10 comprises layers of materials which exhibit different thermal coefficients of expansion (TCE) so as to enable a flexure upon application of heat. In a further embodiment, a piezoelectric layer is adhered to a support layer and, depending upon the state of energization of the piezoelectric layer, a deforming force is applied to cantilever arm 10.

In FIG. 1, cantilever arm 10 extends from a pedestal 12 which extends upwardly from a substrate 14. On the upper surface of pedestal 12 are a plurality of conductive lines 16 which enable application of control currents to various portions of cantilever arm 10 (and to other portions of the actuating structures to be described below).

In embodiments which employ thermal actuation, cantilever arm 10 comprises at least two layers of material, one layer 18 comprising, for instance, silicon nitride which exhibits a TCE of 2.8 ppm/°C. and a second layer comprising polysilicon 20 which exhibits a TCE of 2.4 ppm/°C. When heat is applied to such a structure, silicon nitride layer 18, due to its higher TCE, expands at a faster rate than polysilicon layer 20. If silicon nitride layer 18 resides on top of polysilicon layer 20 and one end of cantilever arm 10 is tethered to a support, heat applied to layers 18 and 20 will cause a concave flexure of cantilever arm 10 such that the untethered end thereof moves towards substrate 14. If the positions of layers 18 and 20 are reversed, such that the silicon nitride layer 18 is on the bottom, application of heat causes an upward flexure of the untethered end of cantilever arm 10.

To achieve a heating action within cantilever arm 10, conductive regions 22 are created in polysilicon layer 20 by deposition of dopants to create resistive traces therein. Further, by appropriate selection of dopants and doping levels, highly conductive traces can also be established within polysilicon layer 20 which allow transmission of control signals to other cantilever structures.

Structures such as shown in FIGS. 1 and 2 are fabricated by successive deposition of films of various semiconductor materials (and other materials) using patterning techniques that are common to the photolithographic art. Sacrificial layers are employed, such as silicon dioxide, which are removed using an etch (e.g., hydrofluoric acid) to free the movable portions of the microstructure at the end of processing. During construction of the microstructure, successive deposited and patterned layers include, as indicated above, polysilicon with heater areas implanted, silicon nitride and aluminum contact regions on pedestal 12.

The silicon dioxide release layer is created by chemical vapor deposition using silane and oxygen as precursors. The polysilicon films are deposited using pyrolytic decomposition of silane in a chemical vapor deposition process, typically at 620° C. The silicon nitride films are deposited using a precursor of ammonia and silane in a chemical vapor deposition process where the reactor temperature is maintained at 800° C.

The preferred substrate is a semiconductor, such as silicon, in all embodiments. Ceramic substrates may also be used or other materials that are capable of withstanding the high processing temperatures used for fabricating the actuated microstructures.

Pedestal 12 (FIG. 1) forms the tether area between cantilever arm 10 and semiconductor substrate 14. Pedestal 12 may be formed in several ways. One technique utilizes a silicon dioxide layer, which is the same as the sacrificial layer beneath cantilever arm 10. When the sacrificial layer is etched or dissolved away, the silicon dioxide in the pedestal region is also undercut, but the undercut is only partial and a mechanically sound pedestal remains when carefully timed and controlled etch procedure is used.

To create the conductive/resistive regions in polysilicon layer 20, implantation using either boron or phosphorous and then annealing the implanted regions creates the necessary conductive areas. Polysilicon layer 20 is not sufficiently conductive for the resistive regions. Accordingly, the impurities added thereto either via diffusion or by implantation, enable the selective creation of conductive/resistive regions. Further, by controlling the width of conductive regions 22 and the level of dopant implantation, the resistivity of conductive regions 22 can be varied. Certain of conductive traces 22 in arm 10 are made highly conductive so as to enable the transfer of control currents to other cantilever arms in the microstructure.

Figure 3:
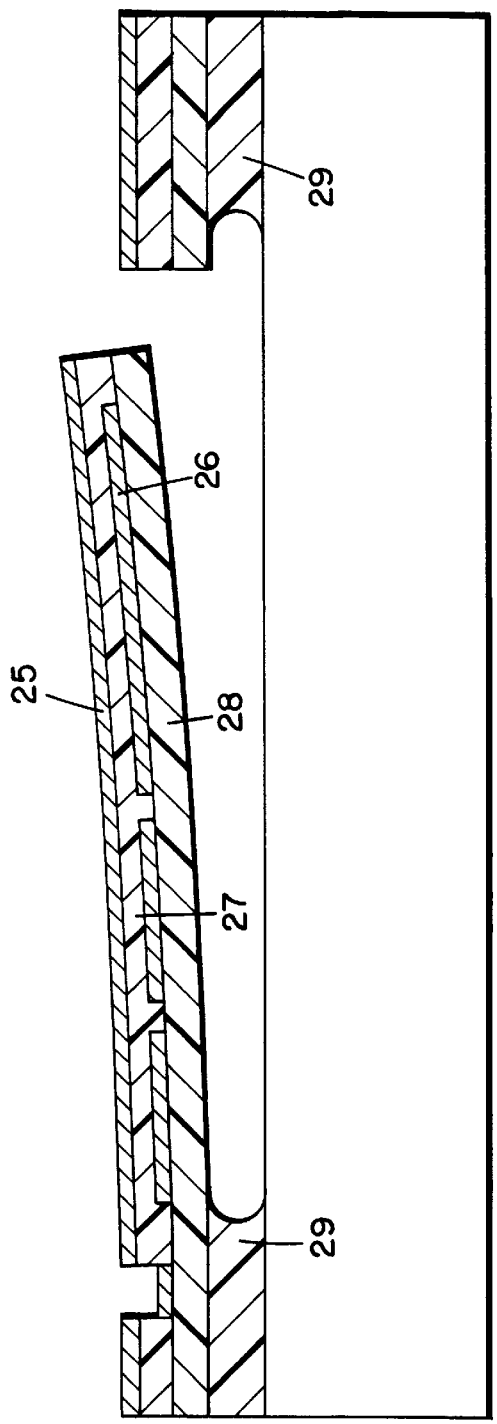
FIG. 3 is a sectional view of a cantilever arm which includes a piezoelectric actuator.

Referring to FIG. 3, a sectional view is shown of a cantilever arm which includes a piezoelectric (electrostrictive) actuator. The piezoelectric actuator comprises conductive layers 25 and 26 (e.g. aluminum) which sandwich a zinc oxide layer 27. A silicon dioxide support layer 28 is bonded to conductive layer 26 and rests upon a sacrificial layer 29. Upon application of a voltage between conductive layers 25 and 26, zinc oxide layer exhibits a piezoelectric effect which causes a contraction in its planar dimension. Accordingly, the uneven stress existing between silicon dioxide layer 28 and zinc oxide layer 27 causes a flexure of the cantilever arm upwardly. If the structure shown in FIG. 3 is inverted, the concave flexure is downward.

In both the thermal and the piezoelectric embodiments of the invention, it is the differential stress of one layer versus another layer which induces the flexure in the respective cantilever arm structure.

Figure 4A:
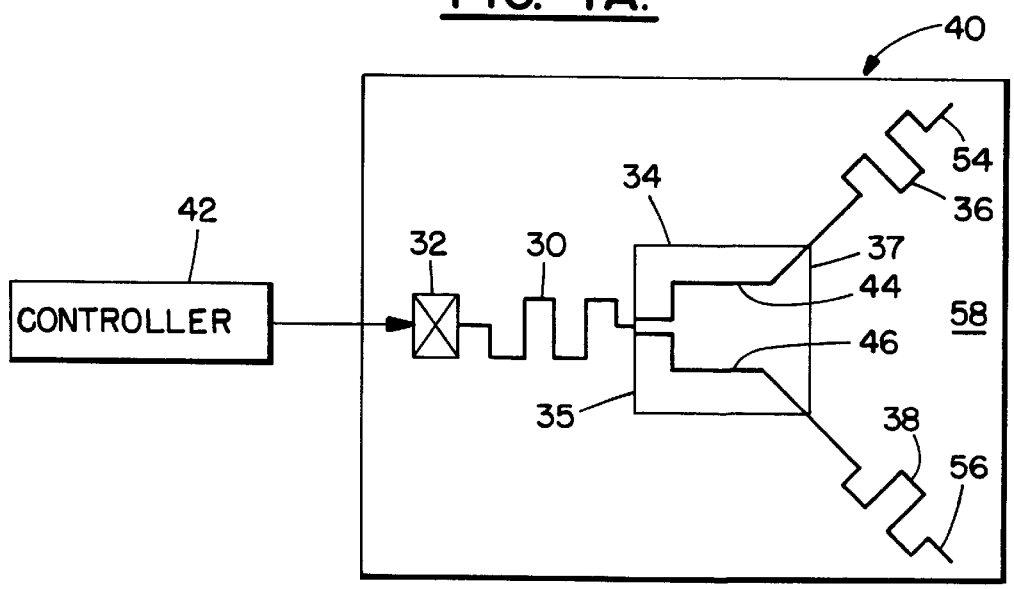
FIG. 4a is a schematic view of a microstructure actuating mechanism utilizing plural meandering cantilever arms, such as shown in FIG. 1.
Figure 4B:
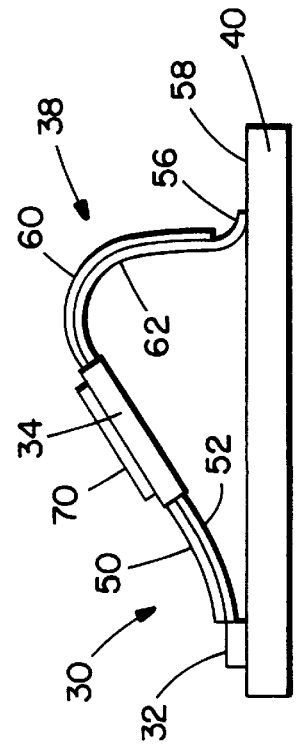

Referring now to FIGS. 4a and 4b, a first embodiment of a preferred microstructure actuating mechanism is shown. In each of the embodiment shown in FIGS. 4–10, the cantilever arms are displayed schematically, but take the form generally shown in one of FIGS. 1–3. Cantilever arm 30 is tethered to a pedestal 32 and is further connected to a platform 34. Platform 34 takes a generally rectangular shape and has two additional cantilever arms 36 and 38 extending therefrom. In each case, the distal end of cantilever arms 36 and 38 is free and is positioned in contact with substrate 40. A controller 42 connects to the conductive traces on pedestal 32 and thereby makes electrical connections to the conductive traces within cantilever arm 30. At least a pair of those conductive traces are coupled, via conductive lines 44 and 46, to cantilever arms 36 and 38, respectively. Controller 42 is thereby enabled to independently control the flexure state of any of cantilevers 30, 36 or 38, as the case may be.

Referring to FIG. 4b, a thermally actuated embodiment of cantilever arm 30 comprises an upper layer of polysilicon 50 and a lower layer of silicon nitride 52. As the distal end of cantilever arm 30 is rigidly connected to edge 35 of platform 34, a heating of cantilever arm 30 causes a counterclockwise movement of platform 34.

To aid and stabilize the movement of platform 34, cantilever arms 36 and 38 are tethered to edge 37 of platform 34.

The distal ends of 54 and 56 of cantilever arms 36 and 38 are free and rest upon upper surface 58 of substrate 40. Each of cantilever arms 36 and 38 (in a thermally activated embodiment) is comprised of an upper layer of silicon nitride 60 and a lower layer of polysilicon 62 which includes conductive and resistive regions implanted therein, as described above.

Controller 42, by application of currents to cantilever arms 36 and 38 is able to cause independent flexure of each thereof which causes distal ends 54 and 56 to slide along surface 58 towards platform 34, thus raising edge 37 of platform 34. If it is desired to cause a change in the angular position of platform 34, controller 42 is enabled to alter the current flow in each of cantilever arms 36 and 38 to independently vary the flexure thereof, and the roll, yaw, or pitch orientations of platform 34. As can thus be seen, by selective application of control currents to cantilever arms 30, 36 and 38, substantial alterations in the position of platform 34 can be achieved. Further, by applying a reflective coating 70 to the upper surface of platform 34, the movement of platform 34 can either be monitored by the sensing of reflections of an incident optical beam or can be used to scan the optical beam, as the case may be.

Figure 5:
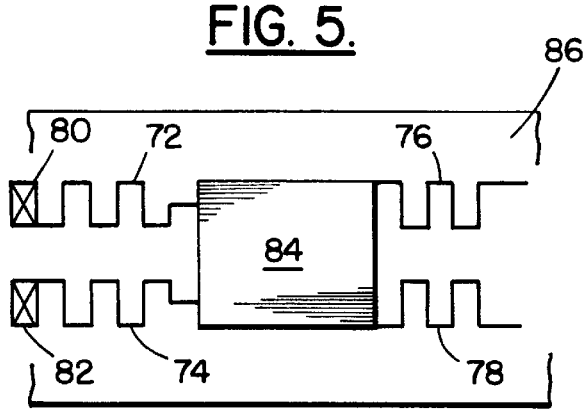
FIG. 5 is a second embodiment of a microstructure actuating mechanism in accordance with the invention.

Turning now to FIG. 5, a second embodiment of the microstructure actuating mechanism is illustrated and, in this instance, includes four independently controllable cantilever arms 72, 74, 76 and 78. Cantilever arms 72 and 74 are tethered between pedestals 80 and 82 and platform 84. The proximal ends of cantilever arms 76 and 78 are connected to platform 84, but their respective distal ends are free to move along substrate 86. Each of pedestals 80 and 82 includes electrical connections to a controller (not shown in FIGS. 5,6) which enable independent control currents to be applied to the respective cantilever arms.

Figure 6:
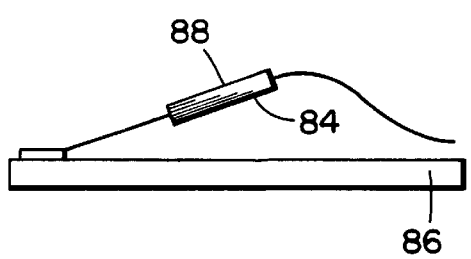
FIG. 6 is a side view of the microstructure actuating mechanism of FIG. 5.

The difference in the structures of FIGS. 4 and 5,6 is that the dual cantilever arms 72 and 74 provide additional stability and positioning in the roll dimension for platform 84. Further, the provision of the in-line cantilever structures (e.g. 72, 76 and 74,78) enable platform 84 to exert greater force on any device being actuated which requires for its impelling force, contact with the upper surface 88 of platform 84.

Figure 7:
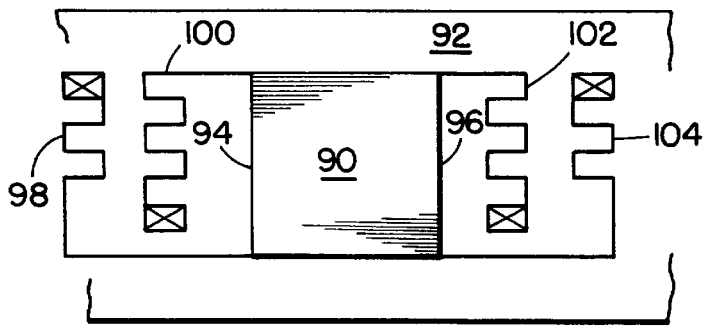
FIG. 7 is a plan view of a third embodiment of a microstructure actuating mechanism incorporating the invention.
Figure 8:
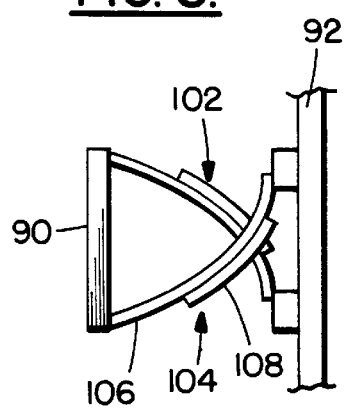
FIG. 8 is a side view of the microstructure actuating mechanism of FIG. 7.

Referring to FIGS. 7 and 8, a third embodiment of the invention is illustrated wherein a platform 90 is movable in a levitation manner from a substrate 92. To accomplish such levitating action, plural cantilever arms are arranged in a generally parallel orientation to opposing edges 94 and 96 of platform 90. More specifically, cantilever arms 98 and 100 are tethered to pedestals on substrate 92 and are further connected to opposing corners along edge 94 of platform 90. Cantilever arms 102 and 104 are similarly connected between pedestals and opposing corners along edge 96 of platform 90. The end view of FIG. 8 illustrates that each of cantilever arms 102 and 104 (and 98 and 100 which are not visible in FIG. 8) are comprised of at least dual actuating layers, wherein uppermost layer 106 is, for instance, polysilicon and lowermost layer 108 is, for instance, silicon nitride. Accordingly, when each of the cantilever arms is heated by an applied control current, each thereof is cause to flex in the manner shown in FIG. 8, causing platform 90 to levitate from substrate 92. If it is desired to orient platform 90 oriented in other than a parallel fashion with respect to substrate 92, appropriate controlling currents can be applied to the respective cantilever arms to cause them to flex at different amounts, thereby enabling a canted orientation of platform 90 as it is raised by flexure of the respectively coupled cantilever arms.

Figure 9:
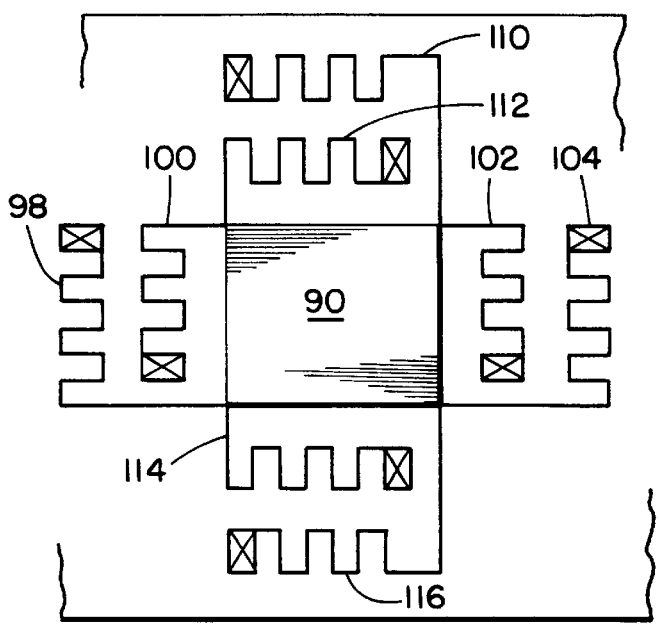
FIG. 9 is a plan view of a fourth embodiment of a microstructure actuating mechanism incorporating the invention.
Figure 10:
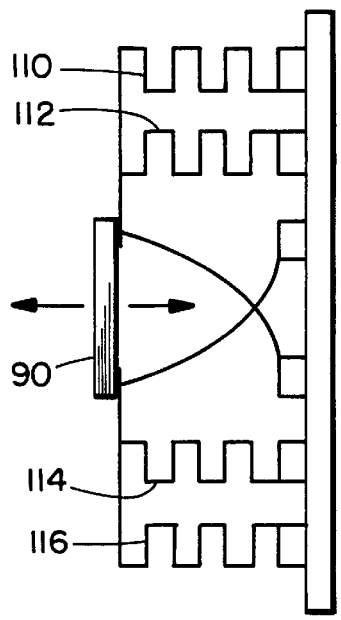
FIG. 10 is a side view of the microstructure actuating embodiment of FIG. 9.

FIGS. 9 and 10 illustate a fourth embodiment of the invention which is similar to that shown in FIGS. 7 and 8 but includes added cantilever arms 110, 112, 114 and 116. Operation of the aforesaid cantilever arms, in conjunction with cantilever arms 98, 100, 102 and 104 enable vertical movement of platform 90 in the levitation manner described for FIGS. 7 and 8. The provision of additional cantilever arms 110, 112, 114 and 116 provides added stability to platform 90 when it is in the levitated state. As with the configuration shown in FIGS. 7 and 8, independent control of each of the cantilever arms shown in FIGS. 9 and 10 is possible, leading to an ability to orient platform 90 in any of many orientations.

Figure 11:
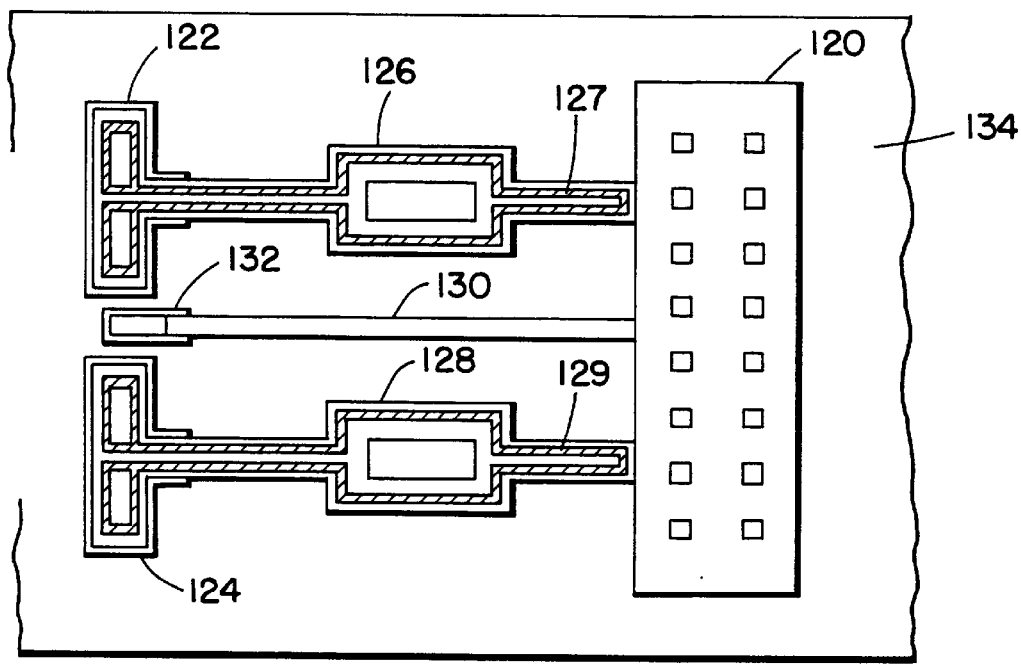
FIG. 11 is a plan view of a fifth embodiment of a microstructure actuating mechanism incorporating the invention.
Figure 12:
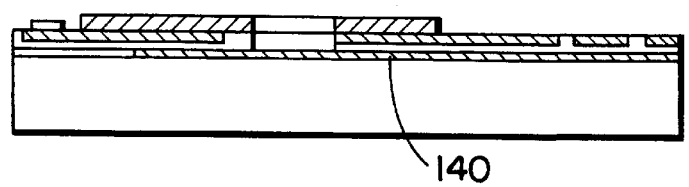
FIG. 12 is a side view of FIG. 11, prior to removal of sacrificial layer.
Figure 13:
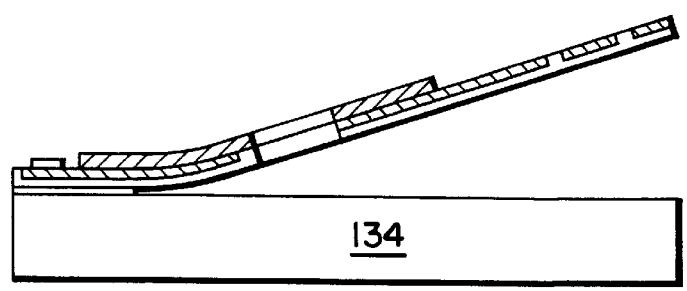
FIG. 13 is a further side view of the microstructure actuating mechanism of FIG. 11, after removal of the sacrificial layer.
Figure 14:
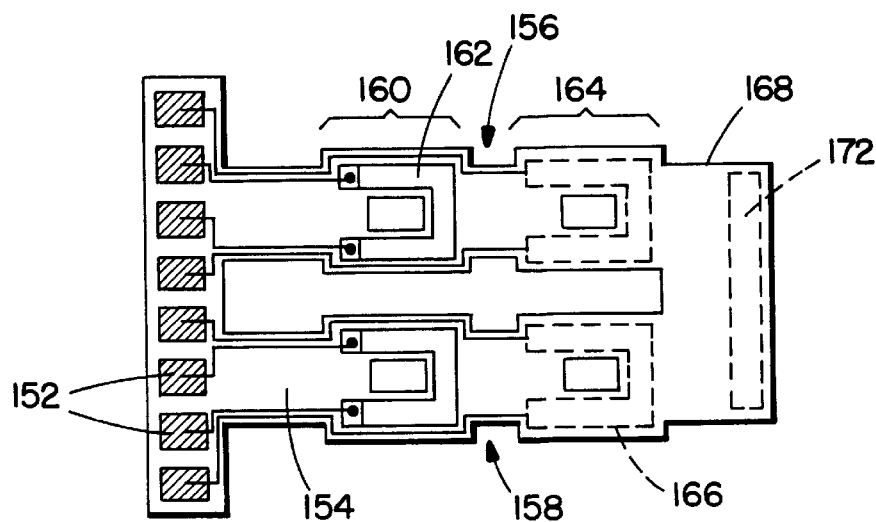
FIG. 14 is a plan view of a sixth embodiment of a microstructure actuating mechanism incorporating the invention.

Turning now to FIGS. 11–13, a fifth embodiment of the invention is illustrated. A platform 120 is tethered to a pair of pedestals 122 and 124 via cantilever arms 126 and 128, respectively. Each cantilever arm is comprised of a dual layer structure (such as that described previously) to enable either a heating or piezoelectric actuation thereof to cause each of the cantilever arms to flex and move platform 120. Assuming thermal actuation, resistive conductors 127 and 129 enable a selective heating of each layer in accordance with control currents applied thereto and a resultant flexure of cantilever arms 126 and 128.

A passive cantilever arm 130 extends between platform 120 and pedestal 132 and stabilizes of platform 120 in roll, pitch, yaw or elevation attitudes. Further, passive cantilever 130 also act as a conductor to enable a dc voltage to be applied to platform 120 from pedestal 132, to enable an electrostatic hold down of platform 120 onto substrate 134.

The microstructure of FIG. 11 is adapted to lower temperature processing than the previous embodiments. An initial surface deposition of silicon nitride, using chemical vapor deposition and anneal, is placed over a starting substrate material of single crystal silicon. Next, a polyimide layer is spun on, followed by a patterned tantalum silicide layer. Next a layer of patterned silicon dioxide which is deposited by plasma enhanced chemical vapor deposition (PECVD), followed by further layers of tantalum silicide, chromium and gold.

The polyimide can be either a photosensitive type or a photo-insensitive type. A photo-insensitive polyimide requires a separate patterned photoresist cover film as a shadow mask to enable a patterning of the polyimidee. Tantalum silicide is sputtered, using a conventional dc magnetron sputtering system. The sputtered tantalum silicide is annealed at a temperature below 375° C. in order to avoid a deterioration of the underlying polyimide film. The chrome film is 20 nanometers in thickness and serves to provide adhesion for the overlying sputtered 200 nm gold metal contact film.

The metal films contact the tantalum silicide to provide an electrical path for thermal heating of the tantalum silicide resistance regions. Note that FIG. 12 illustrates the structure of FIG. 11, prior to removal of the polyimide layer 140. To achieve a release of the cantilever arms 126 and 128 and platform 120 from substrate 134, the polyimide is etched, using an oxygen plasma type reactor. The plasma action releases the cantilever arms and platform 120 in the manner shown in FIG. 13.

Figure 15:
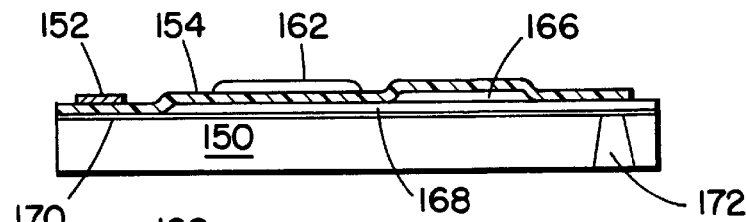
FIG. 15 is a side view of the microstructure actuating mechanism of FIG. 14, prior to removal of a sacrificial layer.

Turning now to FIGS. 14–18, a sixth embodiment of the invention is shown wherein each cantilever arm includes two separately controllable actuating segments. The side view of FIG. 15 illustrates the microstructure actuating mechanism, prior to release from substrate 150. A chrome gold metal electrical contact pad 152 makes contact with a sputtered tantalum silicide layer 154 which forms one layer of each of cantilever arms 156 and 158 (see FIG. 14). A first actuator segment 160 is created by depositing a silicon dioxide layer 162 onto tantalum silicide layer 154. A second actuating segment 164 is created by positioning a silicon dioxide layer 166 beneath tantalum silicide layer 154. The entire structure is supported by a polyimide sacrificial layer 168 which, in turn, rests on a silicon nitride layer 170.

Substrate 150 includes an aperture 172 which may be used as a valve aperture or an optical shuttering aperture.

Figure 16:
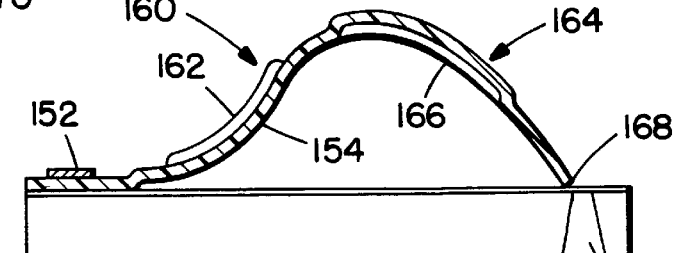
FIGS. 16–18 illustrate a sequence of operations of the microstructure actuating mechanism of FIG. 14 to achieve a shuttering operation of an aperture.

When a current is applied via contact 152 to tantalum silicide layer 154, the resistivity of the layer causes a heating of the cantilever arm, and a flexure thereof due to the unequal TCEs of the tantalum silicide/silicon dioxide layers. Accordingly, as shown in FIG. 16, actuator segment 160 curls in a counterclockwise direction, whereas actuator segment 164 curls in a clockwise direction, causing terminal end 168 to be drawn back from aperture 172.

Figure 17:
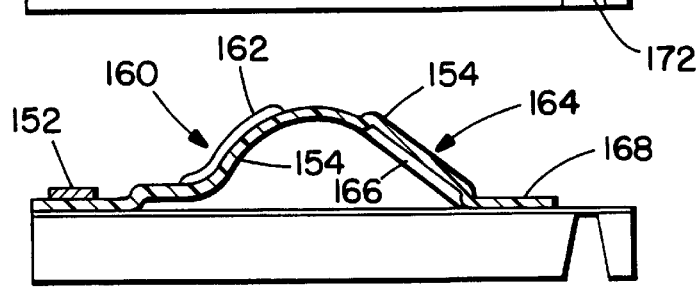
Figure 18:
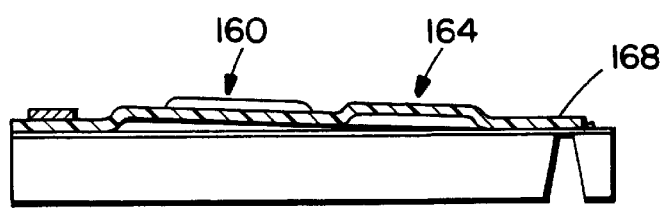

FIGS. 17 and 18 illustrate the recovery effect of a cantilever arm after energization is removed and cooling occurs. Once cooling has completed, as shown in FIG. 18, aperture 172 is shuttered by terminal and 168 of the cantilever arm.

Referring back to FIG. 14, the provision of dual cantilever arms 156 and 158 enables many different orientations of terminal end 168 to be achieved. Accordingly, the use of terminal end 168 as an aperture closure is merely one application of the microstructure actuating mechanism of FIG. 14.

Figure 19:
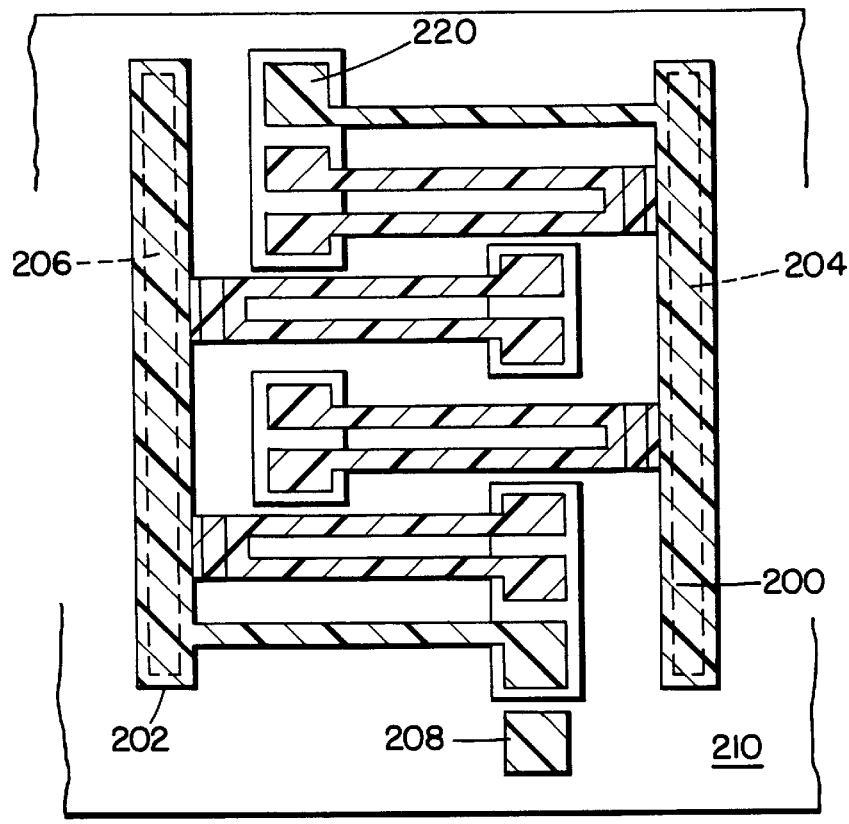
FIG. 19 is a plan view of a seventh embodiment of a microstructure actuating mechanism incorporating the invention.

Referring now to FIGS. 19–22, a microactuated platform is illustrated which adapted to vary an optical opening of a transmission slit. The plan view of the microactuator of FIG. 19 illustrates two microactuated platforms 200 and 202 which are adapted to control the opening size of apertures 204 and 206, respectively. An ohmic connection 208 is provided on substrate 210 to enable a potential to be applied to substrate 210 which, in combination with a dc potential applied to a microplatform via a passive cantilever arm (e.g. arm 220), provides an electrostatic hold down of platform 200.

Figure 20:
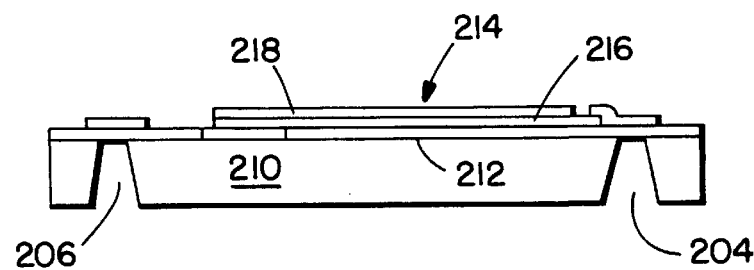
FIG. 20 is a side view of FIG. 19, prior to removal of a sacrificial layer.
Figure 21:
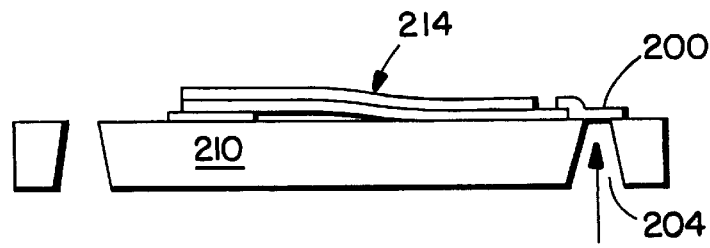
FIGS. 21 and 22 illustrate a shuttering operation carried out by an operation of the microstructure actuating mechanism of FIG. 19.
Figure 22:
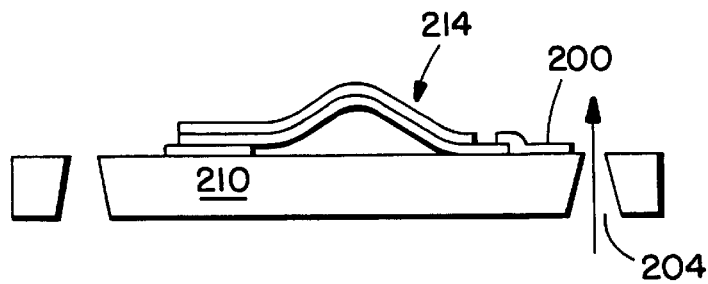

In FIG. 20, a side view of the structure of FIG. 19 is shown, prior to removal of sacrificial layer 212.

Each of the cantilever arms shown in FIG. 19 is comprised of a dual material construct, similar to that described above to achieve a flexure thereof in response to an applied stimulus (i.e., thermal or piezoelectric). In the thermally activated configuration, a representative cantilever arm 214 includes a lower layer 216 which exhibits a higher TCE value than upper layer 218. Accordingly, when an electrical current heats cantilever arm 214, an upward curl appears therein causing microplatform 200 to be drawn back from aperture 204. By controlling the amount of heating applied to cantilever arm 214, the amount of withdrawal of microplatform 200 from aperture 204 can be precisely controlled.

In the thermally activated embodiment of the configuration shown in FIGS. 19–22, substrate 210 preferably comprises a silicon substrate but is coated with a spun-on polyimide which serves as the sacrificial layer. The next deposition is a layer of PECVD silicon dioxide which is, in turn, covered with an aluminum film. These films are of typical thickness of 0.5 microns for such devices. Each film is patterned appropriately to achieve the device structure shown in FIG. 19. The cantilever pedestals may be obtained by either an undercut of the polyimide layer, a patterning of the silicon dioxide, prior to the polyimide spin-on or a deposition of a dielectric film such as silicon nitride to form the pedestal.

To provide electrostatic hold down, as indicated above, a dc potential can be applied between contact 208 (see FIG. 19) and passive cantilever 220. So long as an insulating layer is positioned between microplatform 200 and substrate 210, an electrostatic attraction is thus created which acts to hold microplatform 200 in place on substrate 210.

Figure 23:
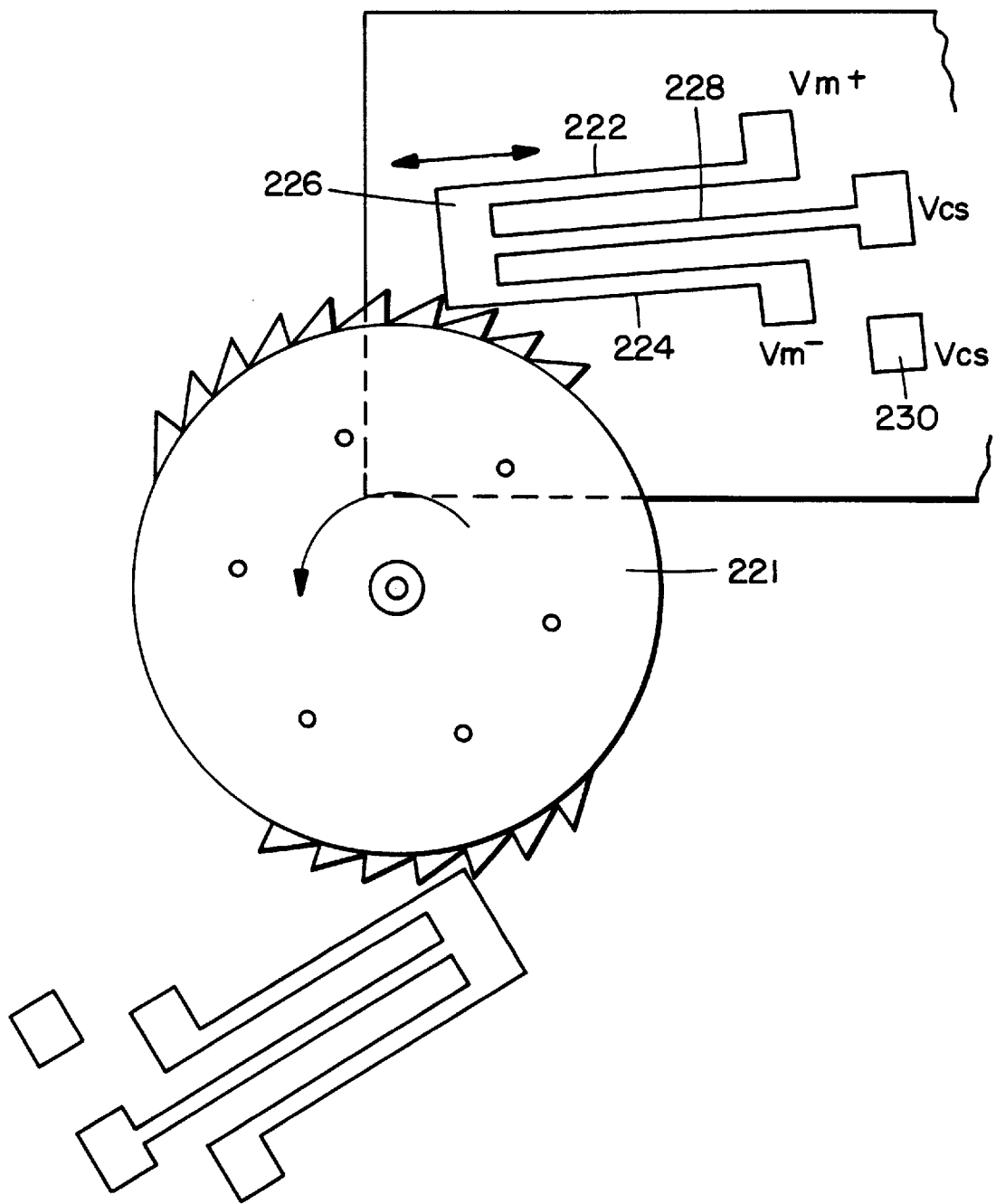
FIG. 23 illustrates an embodiment of the invention wherein an actuating mechanism of the type shown in FIGS. 19–22 can be utilized to increment a geared wheel.

FIG. 23 illustrates a microstructure actuating mechanism used as a driver to cause a geared wheel 221 to rotate. Two separate mechanisms are employed that are constructed in accordance with the arrangement of FIG. 19. More specifically, control currents are applied to active cantilever structures 222 and 224 to cause a reciprocating movement of platform 226. Such reciprocating movement interacts with the gear teeth to rotate wheel 221. Electrostatic voltages applied via passive cantilever arm 228 and substrate contact 230 enable platform 226 to be elevated out of engagement with the gear teeth on wheel 220 and to be withdrawn therefrom by the flexure of cantilever arms 222 and 224. When platform 226 is fully withdrawn, an electrostatic hold down potential is applied via arm 228 and contact 230, at the same time the actuating potential is removed from cantilever arms 222 and 224. The resultant relaxation of the flexure of the cantilever arms, combined with the electrostatic hold down, causes platform 226 to move to the left, interact with the teeth of wheel 221 and to cause a rotation thereof. One or more additional microactuators may be placed about wheel 220 to provide additional driving force thereto.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A microstructure comprising:
   a substrate:
   a platform;
   a first cantilever arm having a proximal end connected to said substrate and a distal end connected to said platform at a first side thereof, said first cantilever arm comprised of a sandwich of a first material layer and a second material layer;
   a second cantilever arm having a proximal end connected to said platform and a free distal end which is positioned to engage said substrate, said second cantilever arm comprised of a sandwich of said first material and said second material; and
   control means enabling movement of said platform by applying signals to cause a differential movement of said first material layer and second material layer in both said first cantilever arm and said second cantilever arm and a resulting flexure of each thereof, said second cantilever arm, through movement of its free end with respect to said substrate, cooperating to move said platform with said first cantilever arm.

2. The microstructure as recited in claim 1, wherein said proximal end of said second cantilever arm is connected to said platform at a second side thereof that is opposed to said first side.

3. The microstructure as recited in claim 2, further comprising:
   a third cantilever arm having a proximal end connected to said platform and a free distal end which is positioned to engage said platform, said third cantilever arm comprised of a sandwich of said first material and said second material, and wherein said control means further applies signals to cause a flexure of said third cantilever arm, said flexure aiding, through engagement with said substrate, movement of said platform.

4. The microstructure as recited in claim 3, wherein said control means comprises a controller and conductive means incorporated into each said cantilever arm, each said conductive means connected to said controller via said proximal end of said first cantilever arm to enable independent control of each said cantilever arm, said conductive means on said second and third cantilever arms coupled to said controller via conductive traces on said platform.

5. The microstructure as recited in claim 1, wherein said first material exhibits a first thermal coefficient of expansion (TCE) and said second material exhibits a second TCE that is different from said first TCE and wherein said signals applied by said control means causes a heating of said first material layer and second material layer and said flexure of each said cantilever arm.

6. The microstructure as recited in claim 1, wherein at least one of said first material layer or said second material exhibits an electrostrictive characteristic and wherein said signals applied by said control means causes a stress in said material which exhibits said electrostrictive characteristic and said flexure of each said cantilever arm.

7. A microstructure comprising:
   a substrate:
   a platform;
   a first cantilever arm having a proximal end tethered to said substrate and a distal end connected to said platform at a first side thereof, said first cantilever arm comprised of a sandwich of a first material layer and a second material layer;
   a second cantilever arm having a proximal end tethered to said substrate and a distal end connected to said platform at a first side thereof, said second cantilever arm comprised of a sandwich of a first material layer and a second material layer;
   a third cantilever arm having a proximal end connected to said platform on a second side thereof that is opposed to said first side and a distal end tethered to said substrate, said third cantilever arm comprised of a sandwich of said first material layer and said second material layer;
   a fourth cantilever arm having a proximal end connected to said platform on said second side thereof that is opposed to said first side and a distal end tethered to said substrate, said fourth cantilever arm comprised of a sandwich of said first material layer and said second material layer; and
   control means enabling movement of said platform by applying signals to cause a differential movement of said first material layer and second material layer in each of said first cantilever arm, second cantilever arm, third cantilever arm and fourth cantilever arm and a resulting flexure of each thereof which causes movement of said platform.

8. The microstructure as recited in claim 7, wherein said first cantilever arm and second cantilever arm extend substantially perpendicularly from said first side and said third cantilever arm and fourth cantilever arm extend substantially perpendicularly from said second side.

9. The microstructure as recited in claim 7, wherein said first cantilever arm and second cantilever arm extend substantially parallel to said first side and said third cantilever arm and fourth cantilever arm extend substantially parallel to said second side.

10. The microstructure as recited in claim 9, further comprising:
   a fifth cantilever arm and a sixth cantilever arm extending substantially parallel to a third side of said platform, each connected between said third side of said platform and said substrate, said fifth and sixth cantilever arms comprised of a sandwich of said first material and said second material and coupled to said control means to be actuated thereby; and
   a seventh cantilever arm and an eighth cantilever arm extending substantially parallel to a fourth side of said platform, each connected between said fourth side of said platform and said substrate, said seventh and eighth cantilever arms comprised of a sandwich of said first material and said second material and coupled to said control means to be actuated thereby.

11. The microstructure as recited in claim 7, wherein said first material layer exhibits a first thermal coefficient of expansion (TCE) and said second material layer exhibits a second TCE that is different from said first TCE and wherein said signals applied by said control means causes a heating of said first material layer and second material layer and said flexure of each said cantilever arm.

12. The microstructure as recited in claim 7, wherein at least one of said first material layer or said second material exhibits an electrostrictive characteristic and wherein said signals applied by said control means causes a stress in said material which exhibits said electrostrictive characteristic and said flexure of each said cantilever arm.

13. A microstructure comprising:
   a substrate:
   a platform;
   a first cantilever arm having a proximal end connected to said substrate and a distal end connected to said platform at a first side thereof, said first cantilever arm comprised of a sandwich of a first material layer and a second material layer;
   a second cantilever arm having a proximal end connected to said substrate and a distal end connected to said platform at a first side thereof, but at a position that is offset from a point where said first cantilever arm is connected, said second cantilever arm comprised of a sandwich of said first material layer and said second material layer; and
   control means for enabling movement of said platform by applying signals to cause a differential movement of said first material layer with respect to said second material layer in either or both said first cantilever arm and said second cantilever arm, to cause a flexure of either or both said first cantilever arm and said second cantilever arm, resulting in movement of said platform.

14. The microstructure as recited in claim 13, further comprising:
   a third cantilever arm physically connected between substrate and said platform, said third cantilever arm and platform being electrically conductive and electrically interconnected;
   dielectric means positioned between said platform and said substrate; and
   means for applying a voltage between said substrate and, via said third cantilever arm to said platform to enable an electrostatic attraction therebetween.

15. The microstructure as recited in claim 13, wherein each said cantilever arm includes a first sandwich region wherein said first material layer resides on a first side of said second material layer and a second sandwich region wherein said first material layer resides on a second side of said second material layer, and said control means is connected to each said region to enable an independent relative movement between each said first material layer and second material layer.

16. The microstructure as recited in claim 13, wherein said substrate includes an aperture and said platform is positioned over said aperture, and wherein
   said control means applies sufficient current to each said cantilever arm to cause a concave distortion thereof and sliding movement of said platform away from said aperture.

17. The microstructure as recited in claim 13, wherein said substrate includes a movable device and said platform is juxtaposed thereto and is positioned in one state to engage and move said movable device, and wherein said control means applies sufficient current to each said cantilever arm to cause a concave distortion thereof and sliding movement of said platform away from said movable device.

18. The microstructure as recited in claim 13, wherein said first material layer exhibits a first thermal coefficient of expansion (TCE) and said second material layer exhibits a second TCE that is different from said first TCE and wherein said signals applied by said control means causes a heating of said first material layer and second material layer and said flexure of each said cantilever arm.

19. The microstructure as recited in claim 13, wherein at least one of said first material layer or said second material layer exhibits an electrostrictive characteristic and wherein said signals applied by said control means causes a stress in said material layer which exhibits said electrostrictive characteristic and said flexure of each said cantilever arm.

* * * * *